United States Patent
Mori et al.

[11] Patent Number: 5,999,270
[45] Date of Patent: *Dec. 7, 1999

[54] PROJECTION EXPOSURE APPARATUS AND MICRODEVICE MANUFACTURING METHOD USING THE SAME

[75] Inventors: Tetsuya Mori, Utsunomiya; Masao Kosugi, Yokohama, both of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/630,137

[22] Filed: Apr. 10, 1996

[30] Foreign Application Priority Data

Apr. 13, 1995 [JP] Japan .................................. 7-088215

[51] Int. Cl.⁶ .................................................. G01B 11/00
[52] U.S. Cl. ............................................................ 356/401
[58] Field of Search .................................... 356/399–401; 250/548, 559.3; 355/43, 53

[56] References Cited

U.S. PATENT DOCUMENTS

| | | |
|---|---|---|
| 3,542,469 | 11/1970 | Hennings . |
| 4,521,082 | 6/1985 | Suzuki et al. . |
| 4,668,089 | 5/1987 | Oshida et al. . |
| 4,676,637 | 6/1987 | Uto et al. ................................ 356/237 |
| 4,719,357 | 1/1988 | Ayata et al. .............................. 250/548 |
| 4,823,012 | 4/1989 | Kosugi . |
| 4,862,008 | 8/1989 | Oshida et al. ........................... 250/548 |
| 5,120,134 | 6/1992 | Kosugi .................................... 356/401 |
| 5,137,363 | 8/1992 | Kosugi et al. .......................... 356/401 |
| 5,268,744 | 12/1993 | Mori et al. .............................. 356/400 |
| 5,309,197 | 5/1994 | Mori et al. ................................ 355/53 |
| 5,602,620 | 2/1997 | Miyazaki et al. ....................... 306/400 |

FOREIGN PATENT DOCUMENTS

0509797A2  10/1992  European Pat. Off. .
3-061802   3/1991   Japan .

*Primary Examiner*—K. P. Hantis
*Attorney, Agent, or Firm*—Fitzpatrick, Cella, Harper & Scinto

[57] ABSTRACT

A projection exposure apparatus includes an illumination optical system for illuminating a first object with exposure light, a projection optical system for projecting a pattern of the first object, illuminated by the exposure light from the illumination optical system, onto a second object, an alignment optical system for illuminating the second object with alignment light, having a wavelength different from the exposure light, and for detecting the alignment light from the second object through the projection optical system, and a moving device for placing the first object on the path of the alignment light when the projection optical system projects the pattern of the first object onto the second object by the exposure light, and for placing the first object out of the path of the alignment light when the alignment optical system detects the alignment light.

19 Claims, 6 Drawing Sheets

PROJECTION EXPOSURE APPARATUS AND MICRODEVICE MANUFACTURING METHOD USING THE SAME

FIELD OF THE INVENTION AND RELATED ART

This invention relates to an exposure apparatus for the manufacture of microdevices such as semiconductor devices, for example. More particularly, the invention is concerned with a projection exposure apparatus for transferring a photomask pattern onto a wafer by projection. Specifically, the present invention is suitably usable in a scanning projection type exposure apparatus wherein, during projection of a photomask pattern upon a wafer, the mask and the wafer are scanningly moved in a timed relation relative to a projection optical system.

Semiconductor device manufacturing technology has advanced remarkably and, in this trend, fine processing technology has developed considerably. In optical processing technology, reduction projection exposure apparatuses having a submicron order resolving power, called steppers, are used prevalently. For further enhancement of the resolution, many attempts are being made such as the enlargement of a numerical aperture (N.A.) of an optical system or the use of a exposure light of shorter wavelength.

On the other hand, there are scanning projection type exposure apparatuses which have attracted much attention. An example of such an exposure apparatus is that: a conventional unit-magnification scanning exposure apparatus having a reflection projection optical system is modified, and a refracting element is incorporated into the projection optical system That is, a reflection system and a refraction system are used in combination. Another example is that: a reduction projection optical system having refracting elements only is used, and both a mask stage and a stage for a photosensitive substrate are relatively and scanningly moved relative to each other at a speed ratio corresponding to the reduction magnification.

With further miniaturization of IC's or LSI's and with further increases in the integration of semiconductor devices, the tolerable range for registration of a mask pattern and a photosensitive substrate pattern are being narrowed. Conventionally, there are three types of observation methods for observing an alignment mark on a photosensitive substrate (wafer) to obtain positional information related to the wafer, such as follows:

(1) Off-axis method: non-exposure light (non-sensitizing light) different from exposure light (sensitizing light) is used and the observation is made without intervention of a projection lens system;

(2) Exposure light TTL method: light the same as the exposure light (sensitizing light) is used and the observation is made through a projection lens system; and (3) Non-exposure light TTL method: non-exposure light (non-sensitizing light) different from exposure light is used and the observation is made through a projection lens system.

(1) In the off-axis method, alignment light does not go through a projection optical system. Thus, it does not depend on the exposure wavelength of the projection optical system and, therefore, there is a relatively wide latitude in the design of the observation optical system.

In the off-axis method, however, due to the physical limitation of the observation optical system and the projection optical system, usually the alignment position is far remote from the exposure position. Thus, it is necessary to drive a stage toward the exposure position, after the alignment process is completed. There will be no problem if the distance between the alignment position and the exposure position (which distance is called the "base line") is stably held constant. Actually, however, there is a possibility of a change with time due. to the effect of the environment (temperature, pressure or mechanism stability attributable to vibration of the apparatus, for example). Furthermore, since the off-axis system does not use the projection optical system, there is a disadvantage that it does not follow a change of the projection optical system such as a change in magnification or focus position with repetition of an exposure process, or a change in magnification or focus position due to the pressure, for example.

As compared therewith, in the TTL alignment method wherein alignment light is projected through a projection optical system, there is an advantage that it follows a change in the projection optical system such as mentioned above. Also, there is no possibility in relation to the base line. Even if there occurs such a problem, the base line is shorter by one digit or more. Thus, it is not easily affected by a change in environment.

(2) In the exposure light TTL method, light the same as the exposure light is used as the alignment light. Since the projection optical system is well corrected with respect to aberration, a good observation optical system is provided. However, in many cases, a wafer is coated with a photosensitive material (resist) onto which an electronic circuit pattern is to be transferred. Usually, a resist shows much absorptivity to shorter wavelengths. Therefore, in observation of an alignment mark formed on the wafer surface, there is a difficulty in observing it through the resist film. With the shortening of the exposure wavelength such as mentioned above, detection of the alignment mark becomes more difficult.

Further, observation of an alignment mark with exposure light involves an additional problem of instability of detection of the alignment mark or failure of the detection because the resist is sensitized by the exposure light.

(3) In the non-exposure light TTL method, light of a wavelength other than the exposure wavelength is used as the alignment light. Thus, there is no problem of resist film absorption or sensitization thereof such as mentioned above. However, a projection optical system is aberration-corrected so as to assure best projection exposure with respect to the exposure wavelength. Thus, when light of a wavelength other than the exposure wavelength is used, the projection optical system produces much aberration.

In consideration of this, when the non-exposure TTL method is adopted, a correction optical system for correcting the aberration of the projection optical system is used to detect the alignment mark (e.g., Japanese Laid-Open Patent Application, Laid-Open No. 61802/1991). However, if an excimer laser such as a KrF laser (248 nm), for example, is used as the exposure light, practically usable glass materials for the projection optical system are limited (e.g., fused silica). As a result, the projection optical system produces large aberration to the non-exposure light. It is therefore very difficult to correct the aberration of the projection optical system by the correction optical system sufficiently. This results in the use of an insufficient numerical aperture or in the failure of structuring a practical correction optical system.

Further, in the non-exposure light TTL method, generally the alignment optical system is arranged to observe a portion quite outside the exposure image height of the projection optical system so as to avoid interference between the alignment light and the exposure light. Because of this, there arises a necessity of using a large projection optical system for the non-exposure light TTL alignment light. Since off-axis light of very high image height of the projection optical system is used, as compared with the on-axis light, degradation of aberration of the projection optical system to the non-exposure light becomes large.

SUMMARY OF THE INVENTION

It is an object of the present invention to provide an exposure apparatus which enables observation of a wafer at a position approximately around the axis of a projection optical system, namely, at a position where the projection optical system produces small aberration with respect to exposure wavelength, and which enables a high precision alignment operation.

In accordance with an aspect of the present invention, there is provided a projection exposure apparatus, comprising: an illumination optical system for illuminating a first object with exposure light; a projection optical system for projecting a pattern of the first object illuminated by said illumination optical system onto a second object; an alignment optical system for illuminating the second object with alignment light of a wavelength different from the exposure light and for detecting alignment light from the second object through said projection optical system; and moving means for moving the first object to a position, different from a position of the first object for the projection exposure, so that said alignment optical system detects the alignment light from the second object through said projection optical system.

In one preferred form according to this aspect of the present invention, the alignment light from the second object comprises light from a portion of the second object, which portion intersects with an optical axis of said projection optical system.

In another preferred form of this aspect of the present invention, said moving means includes a holding member for holding and moving the first object, and wherein said holding member is provided with directing means for directing the alignment light to said alignment optical system when the first object is moved to the position different from the position for the projection exposure.

In a further preferred form of this aspect of the present invention, said directing means comprises an opening formed in said holding member.

In a still further preferred form of this aspect of the present invention, said directing means comprises a reflecting member provided on said holding member.

In a yet further preferred form of this aspect of the present invention, the apparatus further comprises scanning means for scanningly moving the first object and the second object each in a predetermined direction, in a timed relation and relative to said projection optical system, so that the pattern of the first object is projected onto the second object, and wherein said scanning means functions also as said moving means.

In accordance with another aspect of the present invention, there is provided a projection exposure method for illuminating a first object with exposure light and for projecting a pattern of the illuminated first object onto a second object through a projection optical system, said method comprising the steps of: illuminating the second object with alignment light of a wavelength different from the exposure light; moving the first object to a position, different from a position of the first object for the projection exposure, so that the alignment light from the second object is detected through the projection optical system; and detecting, after said moving step, the alignment light from the second object through the projection optical system.

In one preferred form according to this aspect of the present invention, the alignment light from the second object comprises light from a portion of the second object, which portion intersects with an optical axis of the projection optical system.

In another preferred form of this aspect of the present invention, the method further comprises scanningly moving the first object and the second object each in a predetermined direction, in a timed relation and relative to the projection optical system, so that the pattern of the first object is projected upon the second object, and wherein the direction of scanning movement of the first object corresponds to the direction of movement in said moving step.

In accordance with a further aspect of the present invention, there is provided a semiconductor device manufacturing method wherein a pattern of a mask illuminated with exposure light is projected onto a wafer through a projection optical system and wherein, after the projection exposure, the wafer is subjected to a development process, said method comprising the steps of: illuminating the wafer with alignment light of a wavelength different from the exposure light; moving the mask to a position, different from a position of the mask for the projection exposure, so that the alignment light from the wafer is detected through the projection optical system; and detecting, after said moving step, the alignment light from the wafer through the projection optical system.

In one preferred form according to this aspect of the present invention, the alignment light from the wafer comprises light from a portion of the wafer, which portion intersects with an optical axis of the projection optical system.

In another preferred form of this aspect of the present invention, the method further comprises scanningly moving the mask and the wafer each in a predetermined direction, in a timed relation and relative to the projection optical system, so that the pattern of the mask is projected upon the wafer, and wherein the direction of scanning movement of the mask corresponds to the direction of movement in said moving step.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

[Embodiment 1]

Figure 1:
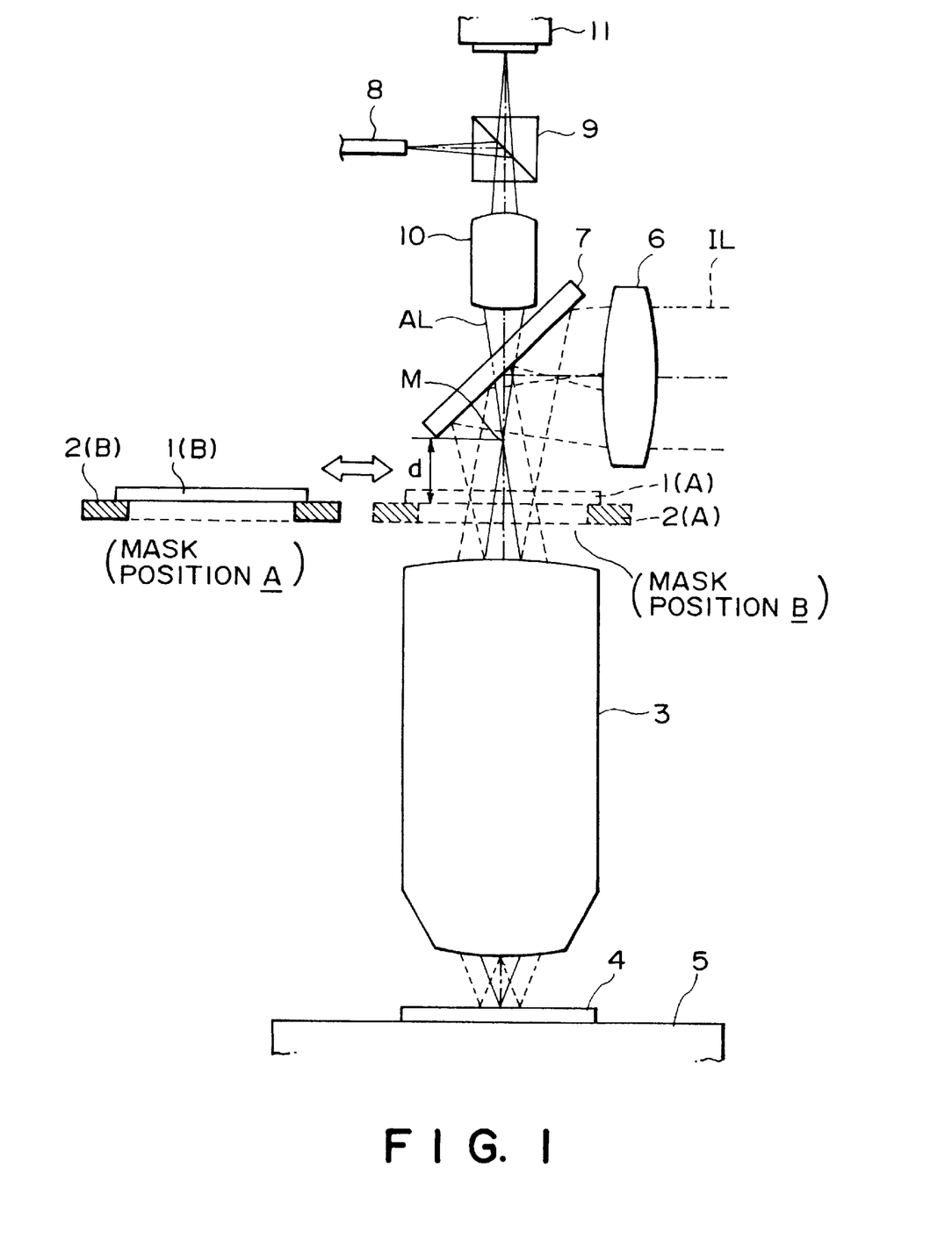
FIG. 1 is a schematic view of a main portion of a projection exposure apparatus according to a first embodiment of the present invention.

FIG. 1 is a schematic view of a projection exposure apparatus according to a first embodiment of the present invention. A mask (original) 1 whose position is detected by a laser interferometer.(not shown) is placed on a mask stage 2 whose position is controlled with respect to X and Y directions. The mask 1 is supported by the frame of the exposure apparatus through the mask stage 2. On the other hand, a wafer (photosensitive substrate) 4 whose position is detected by a laser interferometer (not shown) is placed on a wafer stage 5 whose position is controlled with respect to the X and Y directions. The wafer is supported by the frame of the exposure apparatus through the wafer stage 5 The mask 1 and the wafer 4 are disposed at optically conjugate positions with respect to a projection optical system 3. As regards the projection exposure process, an exposure light flux IL from an illumination system (not shown) illuminates the mask 1 by way of a condenser lens 6 and a mirror 7, such that an optical image of the mask 1 is projected upon the wafer 4 in a size corresponding to the optical magnification of the projection optical system 3.

In FIG. 1, the projection optical system 3 is provided by refracting elements only. However, it may be provided by a combination of refracting elements and a reflection element or elements. Also, the present invention is usable with either of a reduction projection optical system and a unit-magnification projection optical system.

Disposed above the mirror 7 is an optical system for observing the wafer 4. Alignment light flux AL is provided by an alignment light source 8 which produces non-exposure (non-sensitizing) light. The light source may be an optical fiber for guiding light from a separate alignment light source. The alignment light flux AL is reflected by a beam splitter 9, and it goes through an alignment optical system 10 and impinges on the mirror 7. The mirror 7 has such a characteristic that it reflects exposure light and it transmits non-exposure light of a longer wavelength than the exposure light. Thus, the alignment light flux AL is transmitted by the mirror 7 and is directed toward the projection optical system 3. Through the projection optical system 3, the alignment light flux AL illuminates the wafer 4. The alignment light is then reflected and scattered by an alignment mark provided on the wafer 4. The thus reflected and scattered light goes back through the projection optical system 3, and it forms an image of the alignment mark of the wafer 4 at an intermediate image point M which is spaced from the pattern surface of the mask 1 by a distance d. This distance d corresponds to the on-axis chromatic aberration of the projection optical system 3 with respect to the alignment wavelength. After this, the alignment light flux AL is transmitted again through the mirror 7, the alignment optical system 10 and the beam splitter 9. Finally, it re-images the alignment mark of the wafer 4 upon an image pickup device 11 such as a CCD, at an appropriate magnification. On the basis of the position of the image of the alignment mark of the wafer 4 as detected by the image pickup device 11 as well as a measured value of the laser interferometer which controls the wafer stage 5 position, the position of the wafer 4 with respect to the exposure apparatus is measured.

The relative positional relationship between the mask 1 and the wafer 4 is detected in accordance with the following processes.

First, the mask 1 is placed on the mask stage 2 of the exposure apparatus. The mask stage 2 is position-controlled precisely with respect to the exposure apparatus, by means of the laser interferometer. Thus, by placing the mask 1 at a predetermined position on the mask stage 2 by using a mask alignment system (not shown), the mask 1 is positioned precisely with respect to the exposure apparatus.

Subsequently, the process of detecting the position of the wafer 4 with respect to the exposure apparatus starts. First, the wafer is loaded on the wafer stage 5 of the exposure apparatus The wafer stage 5 is position-controlled precisely by means of the laser interferometer (not shown). The wafer stage 5 is then driven so as to bring the wafer 4 to the alignment position below the projection optical system 3. If, at this time, the mask 1 and the mask stage 2 are at the normal projection exposure position shown in FIG. 1 (mask position A), in observation of the wafer 4 through the alignment observation system, the pattern of the mask 1 blocks the alignment light flux AL.

Thus, in the present invention, the mask stage 2 is moved so as to retract the mask 1 to the position shown in FIG. 1 (mask position B), so that it does not block the alignment light flux AL. After this retracting motion, light from the wafer 4 illuminated by the alignment light flux AL as described above is detectable. Moreover, light from an alignment mark in a region (on-axis region) of the wafer, which region intersects with the optical axis of the projection optical system, is detectable. On the basis of the position of the image of the alignment mark of the wafer 4 as detected by the image pickup device 11 as well as a measured value of the laser interferometer which controls drive of the wafer stage 5, the position of the wafer 4 with respect to the exposure apparatus is determined.

The retracting motion provides a large advantage that the alignment observation position can be set in an on-axis area where the projection optical. system 3 shows the smallest aberration, the aberration being a problem in the alignment observation system. If the alignment observation position is set in the on-axis area without the retracting motion, the mask 1 should be formed with an opening for passing the alignment light flux AL. As regards the size of such an opening, if the on-axis chromatic aberration d is 600 mm, the numerical aperture (N.A.) of the alignment light AL at the wafer 4 side is 0.4 and the reduction magnification of the projection optical system is 1:5, then the diameter of the opening upon the pattern surface of the mask is very large, on the order of about 96 mm. This is the size which cannot practically be realized on the pattern surface of the mask 1. Also, as a possibility, a reflection mirror may be retractably inserted so as to pick up the alignment light flux AL adjacent to the optical axis, and such a mirror may be inserted below the mask 1 or above the projection optical system 3. However, disposition of driving means therefor is difficult in the point of interference with the illumination system or the like. Further, if the mirror is positioned below the mask 1, the alignment light flux AL is more and more enlarged and it is practically difficult to place such a large mirror. As compared therewith, the retracting motion of this embodiment is the motion in the horizontal direction. This causes little interference with the projection optical system 3 or the mirror 7, and the structure is very simple. Thus, the mechanism can be placed easily.

As regards the alignment position measurement process, any one of a bright-field image observation method, a dark-field image observation method, an interference measurement method using a grating mark such as heterodyne, and an observation method wherein a detected signal is subjected to Fourier transformation such as FFT and the phase thereof is detected, may be used. The advantageous effects of the present invention are retained with any of these methods.

With the procedure described above, the positions of the mask 1 and the wafer 4 with respect to the exposure apparatus are measured precisely and, as a result, the relative positional relationship between the mask 1 and the wafer 4 is determined.

In the projection exposure process, the mask stage 2 is moved back to the exposure position (mask position A). Then, on the basis of the detected relative positional relationship between the mask 1 and the wafer 4, one of or both of the mask stage 2 and the wafer stage 5 are drive-controlled so that the mask 1 and the wafer 4 are placed in the best aligned state. Subsequently, the mask is illuminated with the exposure light flux IL from an illumination system (not shown), whereby an optical image of the mask 1 is projected on the wafer 4.

When the present invention is applied to an exposure apparatus having a reduction projection optical system (that is, a stepper), the optical image of the mask 1 is to be transferred to different regions on the wafer 4, respectively. In such a case, the essential features of the present invention are retained if the projection exposure procedure is done in accordance with a die-by-die method wherein the alignment operation with respect to one region is just followed by an exposure process thereto, or if the projection exposure procedure is done in accordance with a global method wherein the alignment operation is done to plural regions of the wafer 4 and, subsequently, exposure processes to these regions are performed.

[Embodiment 2]

Figure 2:
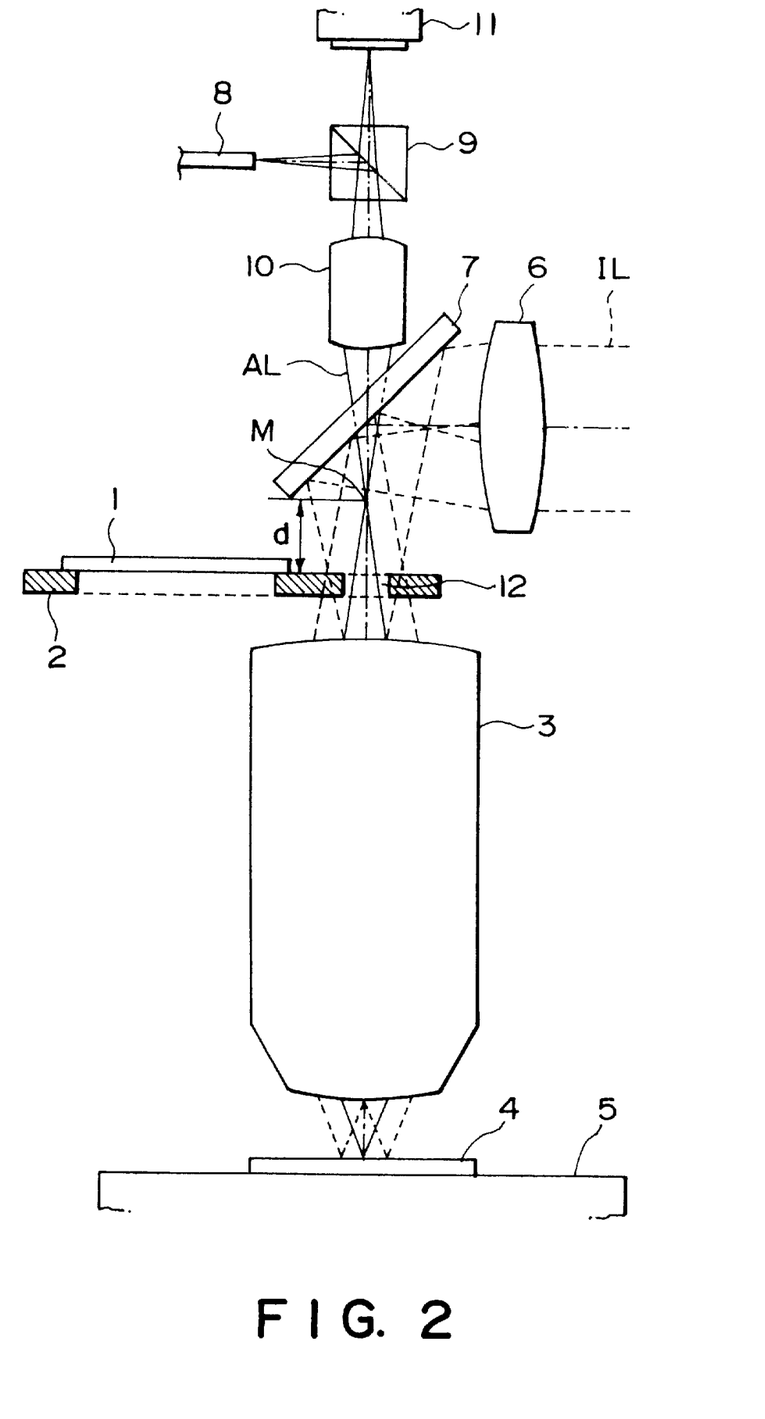
FIG. 2 is a schematic view of a main portion of a projection exposure apparatus according to a second embodiment of the present invention.

The second embodiment of the present invention has a feature that the mask stage 2 is formed with an opening 12 for passage of the alignment light flux AL, such that the amount of retracting motion of the mask stage 2 is reduced.

In the retracting motion of the first embodiment, the mask stage 2 as a whole is moved back to the position where it does not interfere with the alignment light flux AL. In this case, the amount of retracting motion is large and, therefore, the apparatus becomes large. This may lead to a possibility that vibration or the like affects the structure of the apparatus.

In the present embodiment, as illustrated in FIG. 2, an opening 12 for passage of the alignment light flux AL is formed in a portion of the mask stage 2 adjacent to the mask 1. This opening may be a simple bore, or it may be filled with a transmissive material such as glass (the glass may have a function for correcting aberration produced by the projection optical system). Alternatively, a portion of the mask stage may be formed by a transmissive material such as glass. With this arrangement, the amount of retracting motion of the mask stage 2 is reduced. This effectively prevents enlargement of the size of the apparatus and avoids the possibility of the effect of vibration or the like to the structure of the apparatus.

[Embodiment 3]

Figure 3:
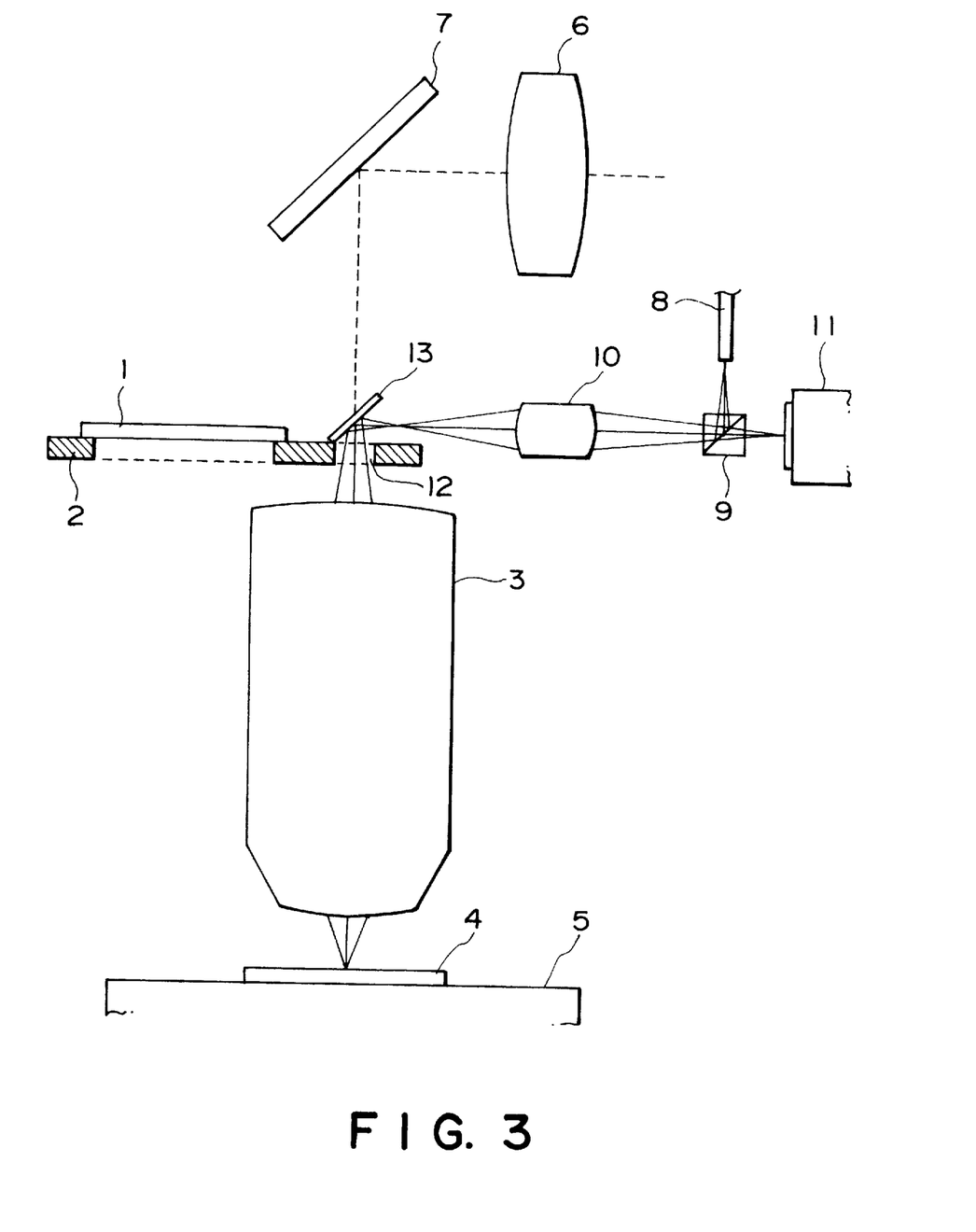
FIG. 3 is a schematic view of a main portion of a projection exposure apparatus according to a third embodiment of the present invention.

The third embodiment has features that an opening 12 for passage of the alignment light flux AL is formed in a portion of the mask stage 2 adjacent to the mask 1 and that an optical reflection member 13 for reflecting the alignment light flux AL so that an alignment optical system is provided in a direction not interfering with the illumination optical system, is provided above this opening 12.

The first and second embodiments use the mirror 7 for separating the exposure illumination system and the alignment optical system. If, however, the exposure wavelength and the alignment wavelength are close to each other, separation of the exposure light and the alignment light by the mirror 7 is not easy. If the exposure wavelength comprises an excimer laser, there is a possibility that a film such as a dichroic film for separating the exposure light and the alignment light is damaged to cause deterioration of the film characteristic. The mirror 7 may be inserted and retracted in the exposure process and the alignment process. However, the reproducibility of the insertion and retraction causes an additional error factor.

Additionally, separation of the exposure illumination system and the alignment optical system by using the mirror 7 necessitates that the exposure illumination system and the alignment optical system are disposed close to each other. This leads to a difficulty in the placement.

In the present embodiment, as shown in FIG. 3, a mirror 13 for reflecting the alignment light flux AL is disposed upon the opening 12 for the alignment light flux AL, which opening is formed in a portion of the mask stage 2 adjacent to the mask 1. The alignment light flux AL reflected by the mirror 13 is directed to the alignment optical system which is disposed at a position remote from the exposure illumination system. The mirror 13 is positioned above the projection optical system 3 during the alignment operation. However, because it is provided on the mask stage 2, it is not positioned above the projection optical system 3 in the exposure process. Therefore, it does not interfere with the exposure light flux IL. Thus, it is sufficient that the mirror 13 has only a property for reflecting the alignment light flux AL while the mirror 7 has only a property for reflecting the exposure light flux IL. There is no necessity of using a mirror having a special function.

Further, since the alignment light flux AL can be separated from the optical axis of the exposure illumination system at a stage close to the mask 1, the design latitude for the arrangement of the exposure illumination system and the alignment optical system is large.

In FIG. 3, the mirror 13 for directing the alignment light flux to the alignment optical system is provided on the mirror 7 side of the mask stage. However, it may be provided on the projection optical system 3 side of the mask stage. This structure eliminates the necessity of forming the opening 12 in the mask stage.

[Embodiment 4]

Figure 4:
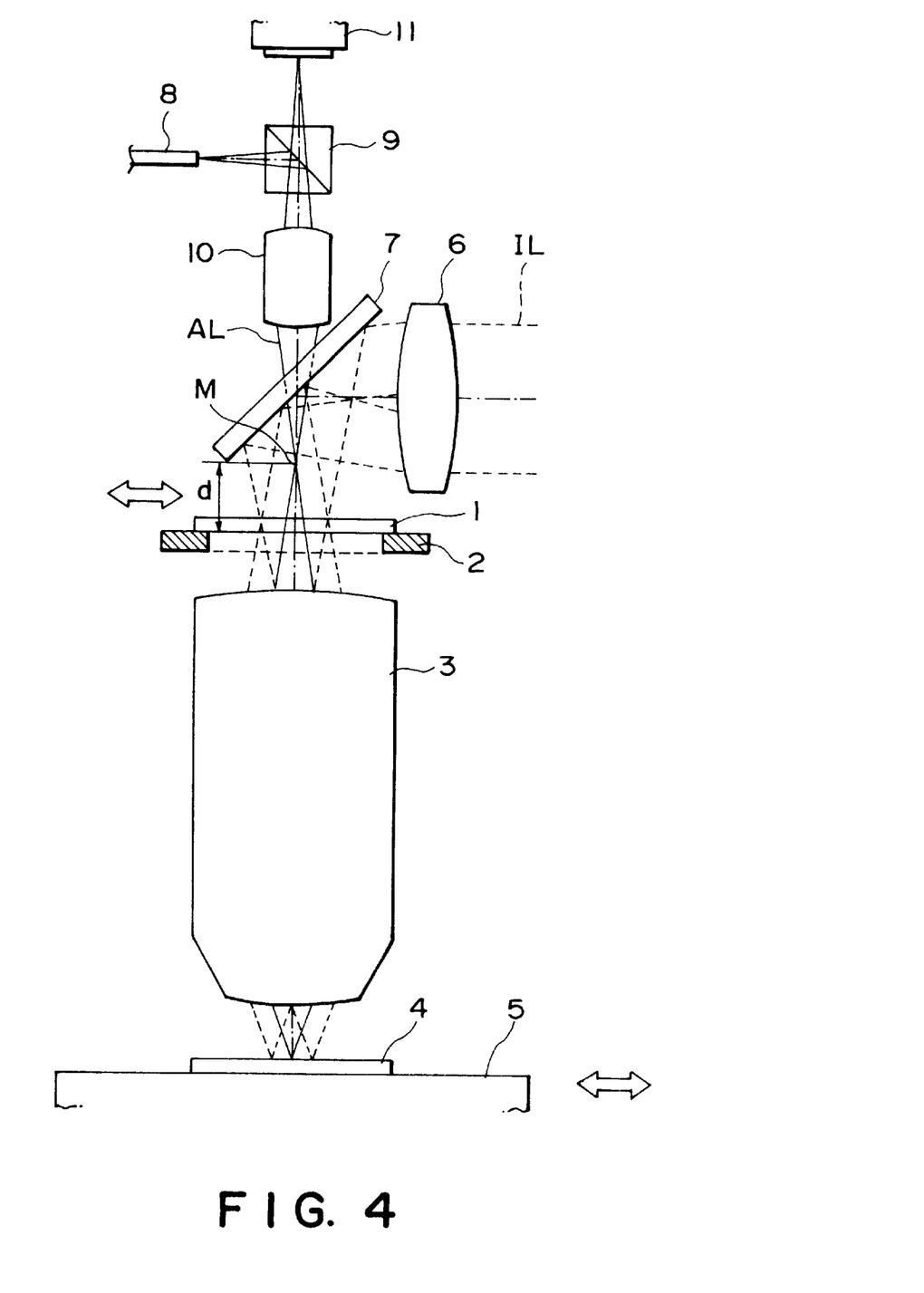
FIG. 4 is a schematic view of a main portion of a projection exposure apparatus according to a fourth embodiment of the present invention.

In this embodiment, the alignment optical system, the mask stage and the illumination system of the first embodiment are applied to a scanning type exposure apparatus. As illustrated in FIG. 4, a scanning projection type exposure apparatus of this embodiment comprises a mask stage 2 movable at least in a first direction along the pattern surface of a mask 1, a projection optical system 3 for projecting the pattern surface or a portion thereof at a predetermined magnification, and a wafer stage 5 for holding a wafer 4 so that the wafer 4 is placed on the imaging plane of the projection optical system 3. The wave stage 5 is movable at least in the first direction. The mask stage 2 and the wafer stage 5 can be moved in a timed relation, at a speed ratio corresponding to the magnification of the projection optical system 3, by which a projected image of the pattern is transferred to the wafer 4. As the first embodiment, for detection of the position of the wafer 4 with respect to the exposure apparatus by using the alignment optical system, the mask 1 is retracted to a position not interfering with the alignment light flux AL. This embodiment has a feature that the direction of retraction coincides with the direction of scan (scanning exposure) in the exposure operation.

In conventional projection exposure apparatuses, called steppers, the driving amount for a mask 1 when it is held by the exposure apparatus is very small. Thus, in order to perform the retracting motion of the present invention, use of an additional driving mechanism is necessary.

In a scanning projection exposure apparatus, however, the mask stage 2 is inherently provided with a function for moving the mask 1 from one end thereof to the other end thereof. Further, within the exposure region, constant speed scan is done essentially. Therefore, for acceleration and deceleration, actually the mask stage 2 is driven by a range larger than the region of the mask 1.

In consideration of this, the direction of scanning exposure motion of the mask stage 2 and the direction of retracting motion of this embodiment are made coincident with each other. This enables embodying the present invention without addition of any driving mechanism. As a matter of course, this embodiment may be effectively used with the arrangement of the alignment optical system, the mask stage and the illumination system of the second embodiment or the third embodiment.

Next, an embodiment of a device manufacturing method using an exposure apparatus according to any of the above-described embodiments, will be explained.

Figure 5:
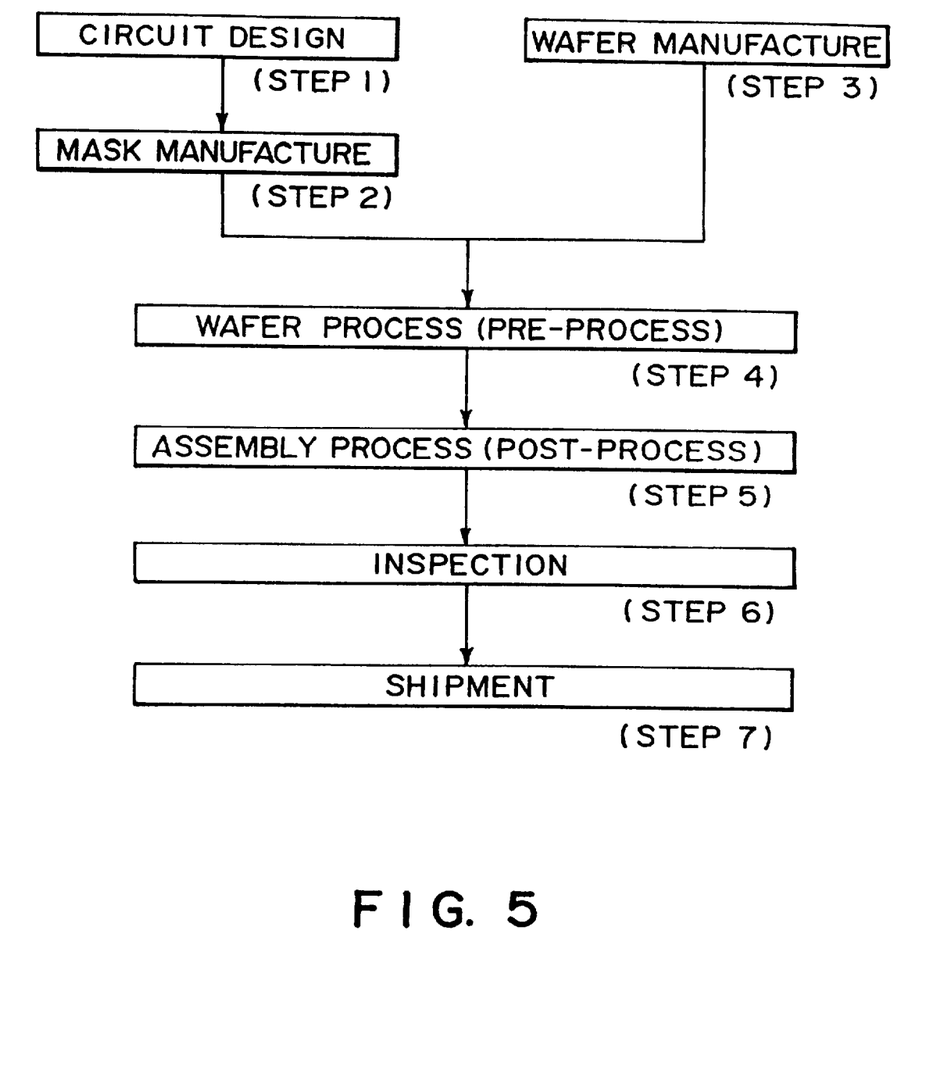
FIG. 5 is a flow chart of microdevice manufacturing processes.

FIG. 5 is a flow chart of the sequence of manufacturing a microdevice such as a semiconductor chip (e.g., an IC or an LSI), a liquid crystal panel, a CCD, a thin film magnetic head or a micro-machine, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, durability check a and so on of the semiconductor devices produced by step 5 are carried out. With these processes, semiconductor devices are finished and they are shipped (step 7).

Figure 6:
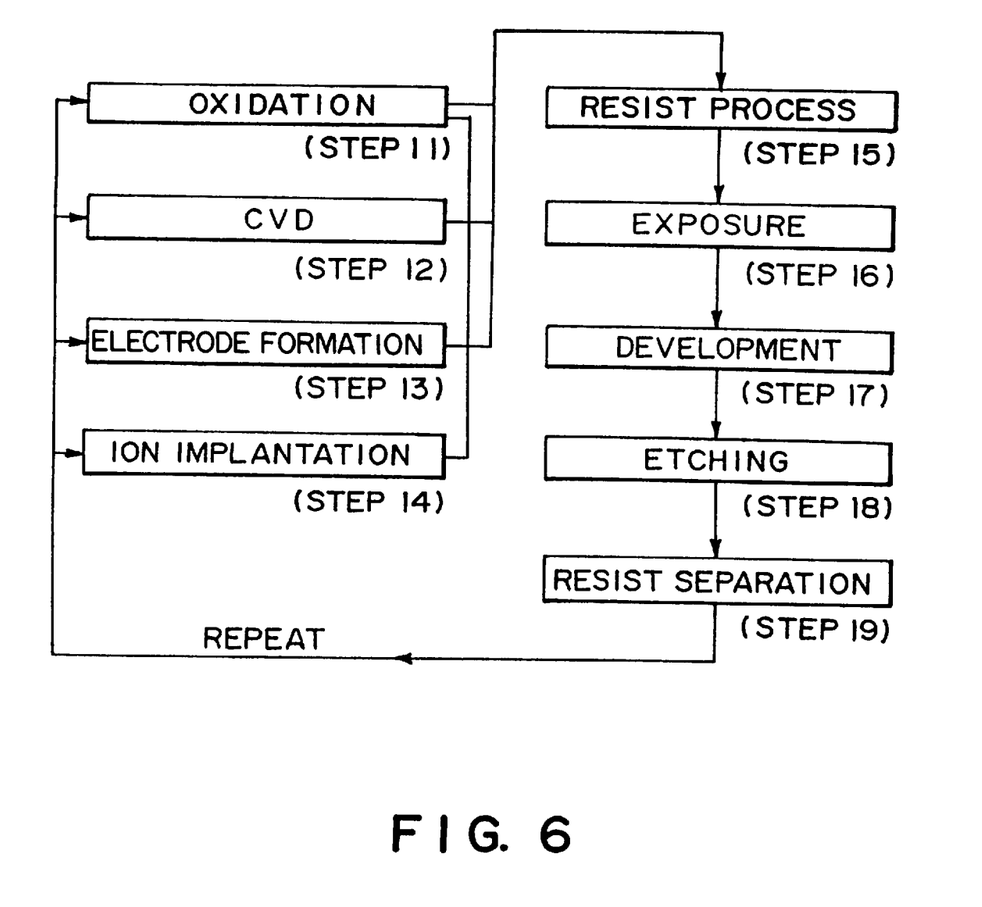
FIG. 6 is a flow chart of a wafer process.

FIG. 6 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:
   an illumination optical system for illuminating a first object with exposure light;
   a projection optical system for projecting a pattern of the first objects illuminated by the exposure light from said illumination optical system, onto a second object;
   an alignment optical system for illuminating the second object with alignment light, having a wavelength different from the exposure light, and for detecting the alignment light from the second object through said projection optical system; and
   moving means for placing the first object on the path of the alignment light when said projection optical system projects the pattern of the first object onto the second object by the exposure light, and for placing the first object out of the path of the alignment light when said alignment optical system detects the alignment light.

2. An apparatus according to claim 1, wherein the alignment light from the second object comprises light from a portion of the second object, which portion intersects with an optical axis of said projection optical system.

3. An apparatus according to claim 1, wherein said moving means comprises a holding member for holding and moving the first object, and wherein said holding member comprises directing means for directing the alignment light to said alignment optical system when the first object is moved out of the path of the alignment light.

4. An apparatus according to claim 3, wherein said directing means comprises an opening formed in said holding member.

5. An apparatus according to claim 3, wherein said directing means comprises a reflecting member provided on said holding member.

6. An apparatus according to claim 1, wherein said moving means comprises scanning means for scanningly moving the first object and the second object each in a predetermined direction, in a timed relation and relative to said projection optical system, so that the pattern of the first object is projected onto the second object.

7. A projection exposure method for illuminating a first object with exposure light and for projecting, through a projection optical system, a pattern of the first object, illuminated by the exposure light, onto a second object, said method comprising the steps of:
   illuminating the second object with alignment light having a wavelength different from the exposure light;
   detecting, by an alignment optical system, the alignment light from the second object through the projection optical system;
   placing the first object on the path of the alignment light when the projection optical system projects the pattern of the first object onto the second object by the exposure light; and
   placing the first object out of the path of the alignment light when the alignment optical system detects the alignment light.

8. A method according to claim 7, wherein the alignment light from the second object comprises light from a portion of the second object, which portion intersects with an optical axis of the projection optical system.

9. A method according to claim 8, further comprising scanningly moving the first object and the second object each in a predetermined direction, in a timed relation and relative to the projection optical system, so that the pattern of the first object is projected upon the second object, and wherein the direction of scanning movement of the first object corresponds to the direction of movement in said placing steps.

10. A semiconductor device manufacturing method wherein a pattern of a mask illuminated with exposure light is projected onto a wafer through a projection optical system and wherein, after the projection exposure, the wafer is subjected to a development process, said method comprising the steps of:

illuminating the wafer with alignment light having a wavelength different from the exposure light;

detecting, by an alignment optical system, the alignment light from the wafer through the projection optical system;

placing the mask on the path of the alignment light when the projection optical system projects the pattern of the mask onto the wafer by the exposure light; and placing the mask out of the path of the alignment light when the alignment optical system detects the alignment light.

11. A method according to claim 10, wherein the alignment light from the wafer comprises light from a portion of the wafer, which portion intersects with an optical axis of the projection optical system.

12. A method according to claim 10, further comprising scanningly moving the mask and the wafer each in a predetermined direction, in a timed relation and relative to the projection optical system, so that the pattern of the mask is projected upon the wafer, and wherein the direction of scanning movement of the mask corresponds to the direction of movement in said placing steps.

13. A projection exposure apparatus, comprising:

an illumination optical system for illuminating a first object with exposure light;

a projection optical system for projecting a pattern of the first object, illuminated by the exposure light from said illumination optical system, onto a second object;

an alignment optical system for illuminating the second object with alignment light, having a wavelength different from the exposure light, and for detecting the alignment light from the second object through said projection optical system; and moving means for placing the first object out of the path of the alignment light when said alignment optical system detects the alignment light, and for placing the first object at the place where the path of the alignment light exists at least when said alignment optical system detects the alignment light, when said projection optical system projects the pattern of the first object onto the second object by the exposure light.

14. An apparatus according to claim 13, wherein the alignment light from the second object comprises light from a portion of the second object, which portion intersects with an optical axis of said projection optical system.

15. An apparatus according to claim 13, wherein said moving means comprises a holding member for holding and moving the first object, and wherein said holding member comprises directing means for directing the alignment light to said alignment optical system when the first object is moved out of the path of the alignment light.

16. An apparatus according to claim 15, wherein said directing means comprises an opening formed in said holding member.

17. An apparatus according to claim 15, wherein said directing means comprises a reflecting member provided on said holding member.

18. An apparatus according to claim 13, wherein said moving means comprises scanning means for scanningly moving the first object and the second object each in a predetermined direction, in a timed relation and relative to said projection optical system, so that the pattern of the first object is projected onto the second object.

19. A projection exposure apparatus, comprising:

an illumination optical system for illuminating a first object with exposure light;

a projection optical system for projecting a pattern of the first object, illuminated by the exposure light from said illumination optical system, onto a second object;

an alignment optical system for illuminating the second object with alignment light, having a wavelength different from the exposure light, and for detecting the alignment light from the second object through said projection optical system;

light between said second object and guiding means, said alignment optical system; and moving means for placing the first object out of the path of the exposure light and for simultaneously placing said guiding means at a position to allow said alignment optical system to detect the alignment light via said guiding means when said alignment optical system detects the alignment light, and for placing the first object on the path of the exposure light and for simultaneously placing said guiding means out of the position when said projection optical system projects the pattern of the first object onto the second object by the exposure light.

* * * * *

UNITED STATES PATENT AND TRADEMARK OFFICE
CERTIFICATE OF CORRECTION

PATENT NO. : 5,999,270  Page 1 of 1
DATED : December 7, 1999
INVENTOR(S) : Tetsuya Mori et al.

It is certified that error appears in the above-identified patent and that said Letters Patent is hereby corrected as shown below:

Column 1,
Line 25, "a" should read -- an --; and
Line 32, "system" should read -- system. --.

Column 2,
Line 6, "due." should read -- due --.

Column 5,
Line 7, "interferometer. (not shown)" should read -- interferometer (not shown); and
Line 15, "stage 5" should read -- stage 5. --.

Column 6,
Line 8, "apparatus" should read -- apparatus. --; and
Line 32, "optical." should read -- optical --.

Column 9,
Line 34, "durability check a" should read -- a durability check --; and
Line 65, "objects" should read -- object, --.

Column 12,
Line 32, "light between said second object and guiding means, said" should read
-- guiding means, for guiding the alignment light between said second object and said --.

Signed and Sealed this

Eleventh Day of June, 2002

Attest:

Attesting Officer

JAMES E. ROGAN
Director of the United States Patent and Trademark Office